United States Patent [19]

Rostoker et al.

[11] Patent Number: 5,393,712
[45] Date of Patent: Feb. 28, 1995

[54] PROCESS FOR FORMING LOW DIELECTRIC CONSTANT INSULATION LAYER ON INTEGRATED CIRCUIT STRUCTURE

[75] Inventors: Michael D. Rostoker, San Jose; Nicholas F. Pasch, Pacific; Ashok K. Kapoor, Palo Alto, all of Calif.

[73] Assignee: LSI Logic Corporation, Milpitas, Calif.

[21] Appl. No.: 84,829

[22] Filed: Jun. 28, 1993

[51] Int. Cl.$^6$ .......................................... H01L 21/02
[52] U.S. Cl. .................................. 437/238; 437/919; 437/978; 437/235
[58] Field of Search ............... 437/978, 919, 195, 238, 437/231, 235; 148/DIG. 81, DIG. 43, DIG. 4

[56] References Cited

FOREIGN PATENT DOCUMENTS 61-289649 12/1986 Japan .................................. 437/978

OTHER PUBLICATIONS

Instability of a $Ge_xSi_{1-x}O_2$ Film on a Gephd $xSi_{1-x}$ Layer, pp. 4444–4446, Journal of Applied Physics vol. 72, No. 9, Nov. 1, 1992.
Hawley, The Condensed Chemical dictionary p. 398, copyright 1977.
Wolf, Silicon Processing for VLSI Era vol.-1 Process Integration p. 226, copyright 1986.
Wolf, Silicon Processing for VLSI Era, vol.-2, process integration of pp. 106–105 and 196–198, copyright 1990.

Primary Examiner—Olik Chaudhuri
Assistant Examiner—S. Mulpuri
Attorney, Agent, or Firm—John P. Taylor

[57] ABSTRACT

A process is described for forming a low dielectric constant insulation layer on an integrated circuit structure on a semiconductor wafer by first forming a composite layer, comprising one or more extractable materials and one or more matrix-forming insulation materials, over an integrated circuit structure on a semiconductor wafer, and then selectively removing the extractable material from the matrix-forming material without damaging the remaining matrix material, thereby leaving behind a porous matrix of the insulation material. In one embodiment, the composite layer is formed from a gel. The extractable material is removed by first dissolving it in a first liquid which is not a solvent for the matrix-forming material to form a solution. This solution is then removed from the matrix-forming material by rinsing the matrix in a second liquid miscible with the first solvent and which also is not a solvent from the matrix-forming material. The second liquid is then preferably removed from the matrix-forming material either by lyophilizing (freeze drying) or by raising the pressure and temperature above the critical point of the second liquid.

44 Claims, 2 Drawing Sheets

PROCESS FOR FORMING LOW DIELECTRIC CONSTANT INSULATION LAYER ON INTEGRATED CIRCUIT STRUCTURE

BACKGROUND OF THE INVENTION

1. Field of the Invention

This invention relates to the production of integrated circuit structures on semiconductor wafers. More particularly, this invention relates to a process for forming a low dielectric constant insulation layer on an integrated circuit structure by first forming a composite layer of a matrix-forming material and an extractable material and then removing the extractable material by either a lyophilizing process or a critical point process to form a porous matrix comprising a low dielectric constant insulation layer.

2. Description Of the Related Art

In the formation of integrated circuit structures, patterned conductive layers must be used to provide electrical interconnection between active and passive devices comprising the integrated circuit structure.

However, the shrinkage of feature sizes in such integrated circuit structures includes shrinkage of the horizontal spacing between adjacent conductors on the same plane. However, such shrinkage of feature size results in a corresponding rise in the impedance of the conductors, as well as crosstalk between the conductors. Such increases in impedance in the integrated circuit structure can result in degradation of the performance of the integrated circuit structure, e.g., reduce the response time of the active devices by increasing the impedance of the lines.

It would, therefore, be desirable if one could reduce the mount of capacitance formed between adjacent lines, either horizontally or vertically, to thereby reduce the impedance of the lines.

Theoretically, this could be done by substituting a different insulation material having a lower dielectric constant, e.g., using some insulation material other than the commonly used $SiO_2$, or by somehow reducing the dielectric constant of the particular insulation material being used, e.g., somehow reducing the dielectric constant of a $SiO_2$ insulation layer.

Of these two alternatives, it has been demonstrated to be preferable to achieve such a lowering of capacitance without the substitution of new insulation materials into the integrated circuit structure.

SUMMARY OF THE INVENTION

The invention comprises a process for forming a low dielectric constant insulation layer on an integrated circuit structure on a semiconductor wafer by first forming a composite layer, comprising one or more extractable materials and one or more matrix-forming insulation materials, over an integrated circuit structure on a semiconductor wafer, and then selectively removing the extractable material from the matrix-forming material without damaging the remaining matrix material, thereby leaving behind a porous matrix of the insulation material. In one embodiment, the composite layer is formed from a gel. The extractable material is removed by first dissolving it in a liquid which is not a solvent for the matrix-forming material to form a solution. This solution is then preferably removed from the matrix-forming material either by lyophilizing (freeze drying) or by raising the pressure and temperature above the critical point of the solution.

DETAILED DESCRIPTION OF THE INVENTION

The invention comprises a process for forming a low dielectric constant insulation layer on an integrated circuit structure on a semiconductor by first forming a composite layer, comprising one or more non-extractable matrix forming insulation materials and one or more extractable materials. The composite layer is contacted by a liquid which is a solvent for the extractable material, but not the matrix-forming material. The resulting solution is then removed either by a lyophilizing process (freeze drying) or by a critical point extraction process wherein the pressure and temperature are raised above the critical point of the solution to thereby remove the solution without damage to the remaining porous network or matrix of insulation material. The presence of air in this resultant layer of porous insulation material reduces the overall dielectric constant of the insulation material, thereby effectively reducing the capacitance of the structure.

Such a low dielectric constant insulation layer is useful when forming an insulation layer between two conductive layers such as, for example, between a conductive silicon layer (e.g., a doped polysilicon layer) and the first metallization layer; or between metallization layers (or metal lines on the same layer) to thereby lower the effective capacitance between the conductive layers separated by such a low dielectric constant insulation layer.

By use of the term herein "low dielectric constant", in describing the resulting porous insulation material, is meant a dielectric constant of less than about 3.9, in contrast, for example, to a conventional $SiO_2$ insulation material having a dielectric constant of 3.9.

Figure 1:
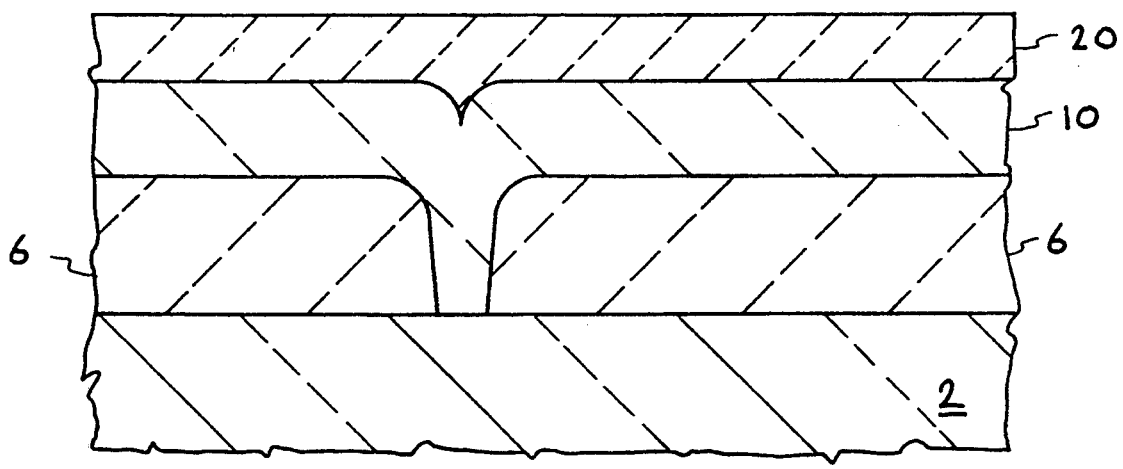
FIG. 1 is a fragmentary vertical cross-sectional view showing the formation, over an integrated circuit structure on a semiconductor wafer, of a composite layer from which the low dielectric constant insulation layer of the invention will be formed.

Referring now to FIG. 1, the invention is shown in its simplest form wherein a conductive polysilicon layer 10 is shown formed over oxide portions 6 and an integrated circuit structure, generally designated at 2. A matrix layer 20, from which the low dielectric insulation layer of the invention will be formed, is shown formed directly over polysilicon layer 10.

The low dielectric constant insulation layer of the invention is formed by first forming over the integrated circuit structure on the wafer a composite layer, such as layer 20 shown in FIG. 1, comprising at least two materials, at least one extractable material, and at least one matrix-forming material. One of these materials, the extractable material, must be capable of extraction from the matrix-forming material after the composite layer is applied to the surface of the integrated circuit structure. In its simplest form, a binary mixture will be used to form the composite layer, with one material (which may or may not be an insulative material) subsequently extracted from the composite layer and one material (which will be an insulation material) remaining after such extraction. However, it will be appreciated that it within the scope of the invention to use two or more materials as the materials to be extracted, or as the matrix-forming materials which will remain as the low dielectric constant insulation material after the extraction, or any combination thereof, in the initial formation of the composite layer.

The Matrix-Forming Material

The matrix-forming material (or materials) must be an insulation material so that the porous matrix which will remain after removal of the extractable material will comprise a low dielectric constant insulation material. Insulation materials which may comprise the matrix-forming material in the practice of the invention include inorganic materials such as silicon oxide ($SiO_2$), silicon nitride ($Si_3N_4$), aluminum oxide ($Al_2O_3$), and undoped silicon (including polysilicon). Organic materials such as, for example, polyimide may also be used as the matrix-forming material. Of these matrix-forming materials, however, silicon oxide ($SiO_2$) is the preferred material because of the widespread use of conventional (non-porous) silicon oxide ($SiO_2$) as an electrical insulation material in integrated circuit structures.

The Extractable Material

The material or materials used in the composite layer which will subsequently be extracted may comprise any material capable of being applied, together with the matrix-forming material, as a solid or a viscous liquid over the integrated circuit structure on a semiconductor wafer to form the composite layer as a substantially homogeneous mixture and then subsequently selectively extracted from the composite layer while leaving the remaining material as a porous matrix. Since the extractable materials will be substantially removed from the composite layer, it is not mandatory that the extractable materials be insulation materials. However, it is preferable that insulation materials be used as the extractable material since it is possible that all of the extractable material may not be removed, either by choice or based on the economics of achieving full removal.

Preferably the extractable material or materials will be easily extractable selectively from the remaining insulation material by solvents which may be used without any deleterious effects noted either on the remaining insulation material or any other exposed portions of the integrated circuit structure.

An example of an extractable material which may be used to form the composite layer comprises germanium oxide, which may be represented by the formula $GeO_x$ where x ranges between 1 and 2. Other extractable materials which may be used in the formation of the composite layer may include, for example, a germanium sulfide or a silicon sulfide.

Formation of the Composite Layer on the Semiconductor Wafer

The composite layer may be formed over the integrated circuit structure on the semiconductor wafer by any conventional means, including, for example, a dry method such as a CVD-type deposition, or by a wet method such as dissolving or dispersing a dry mixture of the matrix-forming material and the extractable material in a liquid and then applying the resulting solution or dispersion as a viscous coating material over the wafer, for example, by spinning the coating material on the wafer in similar fashion to the application of a photoresist mask layer.

Other deposition processes can be used such as, for example, a low temperature oxide (LTO) deposition process wherein the wafer temperature during deposition is maintained within a range of from room temperature, i.e., about 20° C. to about 500° C. A conventional plasma-enhanced chemical vapor deposition (PECVD) process may also be used to form the composite layer.

Such methods for forming the composite layer are more fully described in copending application Ser. No. 08/084,821, entitled LOW DIELECTRIC CONSTANT INSULATION LAYER FOR INTEGRATED CIRCUIT STRUCTURE AND METHOD OF MAKING SAME, filed on Jun. 28, 1993, and assigned to the assignee of this application, and the disclosure of which is hereby incorporated by reference into this application.

The ratio of matrix-forming material to extractable material in the resulting composite layer may range from as little as 0.5 wt. % matrix forming material up to as high as 50 wt. % or even higher if so desired. Usually the matrix-forming will comprise at least about 5 wt. % of the mixture and may be a higher minimum mount, depending upon the minimum desired structural integrity or strength of the matrix of porous non-extractable material remaining after the extraction step. The desired strength of the matrix may, in turn, depend upon the particular liquid and process parameters used to carry out the extraction, as will be discussed below.

It should also be noted that the ratio of matrix-forming material to extractable material will affect the mount or degree of lowering of the dielectric constant of the remaining porous matrix after removal of the extractable material. Therefore, the minimum mount of matrix-forming material used in the formation of the composite layer will usually be dependent upon the desired (and necessary) minimum strength of the resulting porous matrix left after removal of the extractable material, while the maximum mount of matrix-forming material used in the mixture to form the composite layer will be dependent upon the desired lowering of the dielectric constant of the final porous low dielectric constant insulation layer of the invention. Since both minimum mechanical strength and dielectric constant change will be dependent upon the type of material used as the matrix-forming material, and since neither parameter will necessarily vary linearly with concentration, determination of the exact ratio of matrix-forming material to extractable material to be used for a given composite layer will be determined empirically for each particular case.

In the formation of the composite layer, one or more dopants may also be added, for example, to permit the resulting composite layer to flow at a lower temperature, either during the deposition or upon subsequent heating, for planarization purposes. From 0 to 5 wt. % (based on the weight of the non-extractable portion of the composite mixture) of either boron, phosphorus, or arsenic dopants, or mixtures of same, may be used, with the total weight of the dopants in the resulting composite layer not exceeding about 10 wt. % of the non-extractable materials in the composite layer.

The thickness of the composite layer will vary depending upon the desired application and the structural integrity of the insulation material which remains after the extraction. Typically, the thickness of the composite layer may range from as low as about 200 Angstroms to as much as about 20,000 Angstroms, or even thicker in particular instances.

Since the resulting low dielectric constant layer, after the extraction, will be a porous layer, impurities (including dopants) trapped within the porous layer, or included in the non-extracted material, may gradually move to the surface of the low dielectric constant layer which could cause reliability problems. Therefore, in a preferred embodiment of the invention, the low dielectric constant insulation layer is formed with one or more lower and upper solid encapsulation layers of insulation materials which will prevent or inhibit such impurity migration. Such solid encapsulation layers may, for example, simply comprise conventionally deposited $SiO_2$ layers or dual layers of $SiO_2$ and $Si_3N_4$, as will be further described below. Such optional encapsulation layers may range in thickness, for example, from as little as 100 Angstroms to as much as 1000 Angstroms or even higher, if necessary or desired.

Figure 2:
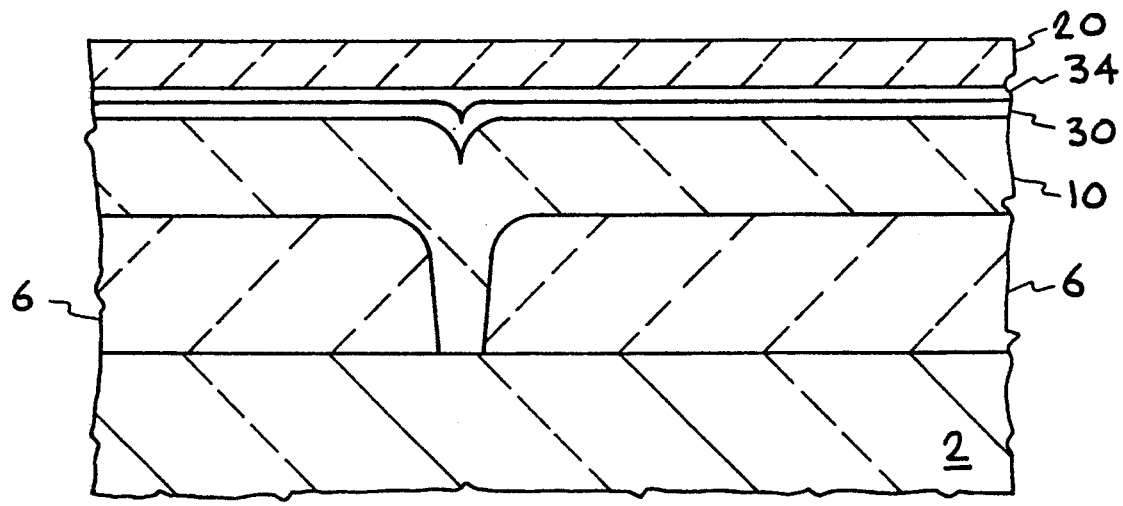
FIG. 2 is a fragmentary vertical cross-sectional view showing formation of the composite layer over a dual layer of non-porous insulation material.
Figure 3:
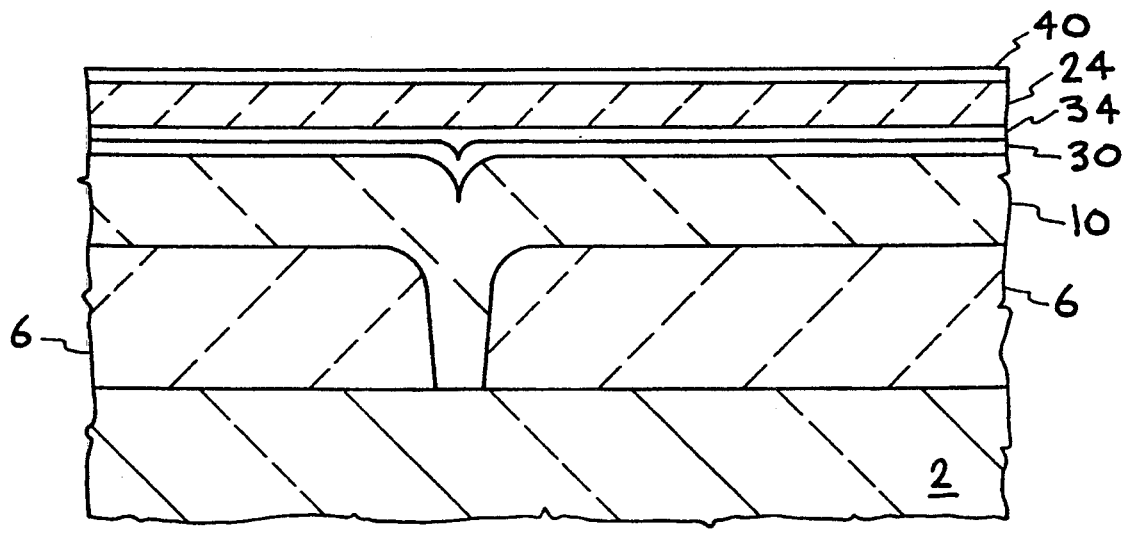
FIG. 3 is a fragmentary vertical cross-sectional view of the structure of FIG. 2 after removal of the extractable material from the composite layer to form the porous low dielectric constant insulation layer and after formation of a single encapsulation layer over the low dielectric constant insulation layer.

The use of such solid encapsulation or capping layers is illustrated in FIG. 2 wherein a first solid insulation layer 30 of silicon oxide is illustrated as formed over conductive polysilicon layer 10 of FIG. 1. A second solid insulation layer 34, which may comprise silicon nitride, is shown formed over insulation layer 30. Together, insulation layers 30 and 34 comprise a dual encapsulation or capping layer which serves to seal the underlying portions of integrated circuit structure 2 and polysilicon layer 10 from composite layer 20 which is shown formed over layer 34. As shown in FIG. 3, an upper capping or sealing layer 40, which may also comprise $SiO_2$, can then be formed over the structure after the extractable material has been removed to form low dielectric constant porous insulation layer 24 of the invention (formerly composite layer 20 of FIG. 2), as will now be described. While the lower encapsulation or capping layer has been shown formed from two layers of material (layers 30 and 34) and upper capping layer 40 is shown as a single layer, it will be understood that this is only for illustrative purposes and either the lower or upper encapsulation layer may comprise either a single layer or a dual layer as desired.

After formation of composite layer 20, the integrated circuit structure may be heated, if desired, to cause layer 20 to flow for planarization purposes. When no metallization is already present on the integrated circuit structure, nor any prior porous insulation layers already formed, the structure may be heated to a temperature of typically from about 200° C. up to about 1100° C., preferably from about 400° C. to about 800° C. If a metallization layer (and/or a first porous insulation layer) already has been formed and the (second) low dielectric constant insulation layer of the invention is being formed between such a metal layer and a subsequent metal layer to be formed thereover, heating of the structure for planarization purposes will be governed by the melting point of the already deposited metal layer (as well as the effect of such a temperature on the previously formed porous layer). For aluminum metallization, for example, the structure should not be heated to a temperature above about 500° C. For copper, for example, the temperature should not exceed about 1000° C. Of course, it will be recognized that such planarization may also be carried out by chemical or mechanical polishing or a combination thereof. This will be found to be particularly useful in those instances where heating the wafer to cause the composite layer to flow, for planarization purposes, would create problems elsewhere on the structure.

Use of a Gel Structure as the Composite Layer

In a particular embodiment, a gel structure may be used to form the initial composite layer, for example, when silicon oxide is used as the matrix-forming material, i.e., when a metal silicate is used as the starting material to form the composite layer. Preferably, the counter ion material will be a material which will not have a deleterious effect upon other portions of the integrated circuit structure, if trace amounts of same remain after the porous low dielectric constant layer is formed, i.e., after the counter ion material has been extracted.

Examples of materials which may be used to form such counter ions include alkali metals, including sodium, potassium, rubidium, and cesium; and alkaline earth metals, such as magnesium, calcium, strontium, and barium. The use of alkali metals is preferred over alkaline earth metals because of the greater solubility of the alkali metals. The use of sodium should preferably be avoided because of the deleterious effects which trace mounts of sodium residues may have on the integrated circuit structure. Generally, a preferred counter ion material will be potassium.

To form the initial composite layer, the mixture of gel-forming materials is initially dissolved in a solvent such as water or an alcohol. The ratio of the mount of this mixture to the solvent may range from about 0.5 volume % up to the solubility of the mixture in the solvent. Generally, the mount of solvent used will be just enough to dissolve the gel-forming components so as to provide a viscous material to be applied to the semiconductor wafer containing the integrated circuit structure so that the gel-forming mass will stay on the wafer. Examples of solvents other than water or an alcohol which may be used as the initial solvent for the gel-forming materials include benzene, ethyl acetate, and dimethyl sulfoxide (DMSO).

The viscous gel-forming solute is applied to the surface of the wafer to a thickness ranging from about 0.02 micrometers ($\mu$m) to about 2 $\mu$m and then allowed to dry to evaporate the solvent, leaving behind the gel layer. The coated wafer may be maintained at room temperature, i.e., about 20° C. or heated up to a temperature as high as 125° C. to evaporate the solvent, i.e., to dry the gel layer. If desired, nitrogen gas may be flowed over the coated wafer surface to assist the drying stage. A slight vacuum down to, for example, about 100 Torr for alcohol, or down to about 15 Torr for water, may also be used.

After the coating solution has dried to form the gel layer, e.g., composite layer 20 shown in FIG. 2, the counter ion may be extracted to form the desired porous low dielectric constant insulation layer of the invention. This is carried out by contacting the gel layer with a second solvent which will dissolve the counter ion from the gel without disturbing the remaining matrix structure and which will be non-crystallizable with the extracted counter ion dissolved therein. This second solvent may be identical to the first solvent in some instances, since the formed matrix structure is not always soluble in the same solvents in which the gel-forming materials are soluble. The second solvent also preferably is a polar solvent, in view of the nature of the material to be dissolved and removed from the matrix structure, i.e., a counter ion. However, in addition, the second solvent must not only be capable of selectively dissolving the counter ion without disturbing the remaining matrix structure, but also the resulting solution must be capable of removal from the matrix structure without damage. The resulting solution must then be removed from the remaining matrix structure in a manner which will not damage the desired remaining matrix structure.

Figure 4:
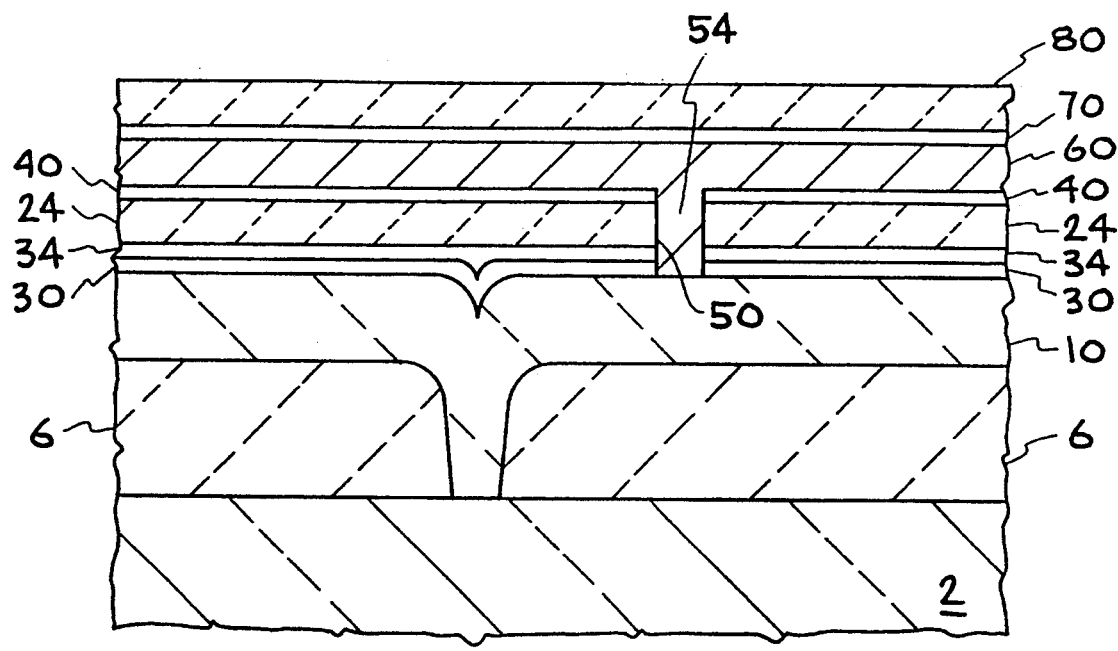
FIG. 4 is a fragmentary vertical cross-sectional view of the structure of FIG. 3 after formation of a contact opening in the first low dielectric constant insulation layer, a patterned first metallization layer formed over the insulation layer, a capping layer formed over the first metallization layer, and a second composite layer formed over the structure in preparation for forming a second low dielectric constant insulation layer.

It should be noted, with particular respect to the formation of the porous low dielectric constant insulation layer in this manner, that the resulting porous matrix is highly hygroscopic in nature. Therefore, the use of one or more sealing layers beneath composite layer 20, such as, for example, non-porous layers 30 and 34, as shown in FIG. 2; and one or more non-porous sealing layers above porous layer 24, such as, for example, layer 40, as shown in FIG. 4, serves the additional function of isolating the hygroscopic low dielectric constant insulation layer from contact with aqueous solutions which may be used in subsequent processing of the integrated circuit structure.

Removal Of the Extractable Material from the Composite Layer

In accordance with the invention, the extractable material is removed from the composite layer by contacting the composite layer with a liquid (or in some instances a gas) which is not a solvent for the matrix-forming material to thereby dissolve the extractable material out of the composite layer, i.e., to form a solution of the extractable material dissolved in the solvent. This solution is then removed from the composite layer.

When a liquid is used to remove the extractable material, the composite layer is contacted with a purified liquid which is a solvent for the extractable material, but not for the insulation material which will be left to form the porous low dielectric layer. By use of the term "purified liquid" is meant a semiconductor grade solvent or better. For example, purified water, e.g., distilled or deionized water, may be used to leach out germanium oxide from a silicon oxide/germanium oxide composite layer. The dissolving of the extractable material to form the solution, may be carried out, for example, by immersing the coated wafer for a time period of at least about 2 minutes up to as long as about 3,000 minutes (50 hours) or longer if desired, in such a purified liquid solvent which may be maintained at a temperature ranging from ambient up to about just below the vaporization point of the liquid.

A dilute acid (i.e., 1 normal or less) such as HCl, or a dilute base (i.e., 1 normal or less) such as $NH_4OH$ may, in some instances, be used to remove the extractable material provided that other materials, including the non-extractable insulation material in the composite layer, are not attacked by such acid or base.

The resulting solution, comprising the solvent and the dissolved extractable material, must then be removed from the composite layer. This is best carried out by first replacing the solution in the composite with fresh solvent, i.e., by rinsing the composite in pure solvent (which could be a second solvent miscible with the first solvent) at least once and preferably a number of times until all of the solution, i.e. substantially all of the dissolved extractable material is no longer in the composite. By "substantially all" is meant that less than 99.9% of the extractable material remains in the resulting porous matrix structure. This may be empirically determined, for example, by monitoring the resistivity of the rinse liquid until the presence of ions (indicating the presence of extractable material) becomes too low to detect, e.g., a resistivity of about 16–17 megohms. If a second solvent is used as the rinse liquid, it too must not be a solvent for the non-extractable material in the composite layer.

The solvent which then remains in the composite, e.g., the second liquid, may then be removed by evaporation. Such removal may be carried out for example, by vacuum drying the layer in a vacuum dryer for a sufficient period of time.

Such a removal of the extractable material from the composite layer is fully described in the aforementioned copending application Ser. No. 08/084,821, entitled LOW DIELECTRIC CONSTANT INSULATION LAYER FOR INTEGRATED CIRCUIT STRUCTURE AND METHOD OF MAKING SAME.

In accordance with the invention, the solvent remaining in the composite, after the steps of dissolving the extractable material and then replacing the resulting solution in the composite with fresh solvent, may also be removed by a lyophilizing (freeze drying) process or a critical point process in which the temperature and pressure are raised to the critical point at which no liquid phase exists. Either of these removal processes eliminate the problem where the surface tension of the liquid phase exceeds the strength of the remaining matrix structure, which could result in damage to the remaining matrix structure. These removal processes will be found to be of particular value when the ratio of matrix-forming material to extractable material is low, resulting in a more fragile, and easily damaged matrix structure remaining after the extractable material has been dissolved out of the composite layer.

However, when the critical point process is used to remove the solvent composite, a solvent must be chosen which will have a low enough pressure and temperature at the critical point to be economically feasible and practical. Water is not a preferred solvent, when the critical point method of removal is used because of its high temperature/pressure critical point. However, alcohols do have a low enough critical point temperature and pressure to permit their use as the solvent in a critical point removal process. For example, ethyl alcohol (with the extractable material dissolved therein) will have a critical point temperature ranging from about 350° C. to about 400° C. and a critical point pressure of about 100 atmospheres. Examples of other liquids, besides alcohols, which may serve as the second solvent in a include, for example, 2-methyltetrahydrofuran (TMF).

The Lyophilizing Process for Removing Extractable Material

When the lyophilizing or freeze drying method is used to remove the solvent (remaining after removal of the dissolved extractable material and rinsing of the structure in fresh solvent to remove substantially all of the resulting solution) the wafer is cooled in a vacuum chamber down to a temperature at which the composite layer, including the solvent therein, becomes a solid. This will comprise cooling the coated wafer down to the freezing point of the solvent, e.g., for a 2-methyltetrahydrofuran (TMF) solvent, down to a temperature of about −136° C. or lower. The vacuum chamber is evacuated, i.e. pumped by a vacuum pump down to a pressure of, for example, using a TMF solvent, about 1 Torr, or lower, to remove substantially all of the resulting frozen solvent.

The length of time needed to remove substantially all of the frozen solvent from the composite layer, leaving behind the desired porous matrix structure, may be determined empirically by, for example, continuing to pump the vacuum chamber for several days followed by weighing the sample. By then repeating the process for shorter periods of time followed by weighing the sample, one can determine the time period needed to remove over 99.9% of the solvent removed over the initial pumping period of several days. One can also determine the time needed to reach this level of solvent removal by analyzing the gas stream with a mass spectrometer. By "substantially all" is meant that less than 99.9% of the solvent remains in the resulting porous matrix structure.

After removal of the solvent therefrom, the coated semiconductor wafer, having the desired porous low dielectric constant insulation layer formed thereon over the underlying integrated circuit structure, may then be allowed to warm up to room temperature, following which the wafer is removed from the chamber to be further processed, for example, as will be discussed below.

The Critical Point Process for Removing Extractable Material

When the critical point process is used to remove from the composite layer the solvent (remaining after removal of the dissolved extractable material and rinsing of the structure in fresh solvent to remove substantially all of the resulting solution), the coated wafer may be placed in a vacuum chamber. The chamber is then sealed and the pressure is raised, for example by pumping a non-reactive gas such as nitrogen, argon, neon, helium, etc. into the chamber until the pressure exceeds the critical pressure. The temperature within the chamber is then raised until it exceeds the temperature at the critical point. A small amount of gas/vapor is then allowed to flow out of the sealed chamber through a small opening while additional non-reactive gas is flowed into the chamber at about the same rate, or at least sufficiently to maintain the pressure above the critical point.

The makeup of the gas/vapor leaving the chamber is then monitored to determine when substantially all of the solvent has been removed from the composite layer, leaving behind only the porous matrix structure which comprises the low dielectric constant insulation layer of the invention. The end point for the critical point solvent removal process may be determined in the same manner as for the lyophilizing solvent removal process, e.g., either by empirically determining the time needed to reach this point of by analyzing the gas/vapor with a mass spectrometer.

The temperature and pressure may now be lowered to ambient and the coated semiconductor wafer, having the desired porous low dielectric constant insulation layer of the invention formed thereon over the underlying integrated circuit structure, may then be removed from the chamber to be further processed as desired.

At this point, if desired, capping layer 40 of non-porous insulation material may be formed over porous low dielectric constant insulation layer 24, as shown in FIG. 3. Capping layer 40 is formed similarly to the encapsulation layer or layers (30 and 34) formed over the integrated circuit structure beneath porous low dielectric constant insulation layer 24. Such a capping layer may be conventionally formed using the same techniques previously described for forming the lower encapsulation layer. If the use of capping layer 40 is either not desired or needed, this step may, of course, be dispensed with.

The resultant low dielectric constant insulation layer may now be conventionally processed, for example to form vias or contact openings 50, as shown in FIG. 4, followed by filling of contact opening with a conductive filler material 54, such as tungsten. A metallization layer 60 is then formed over low dielectric constant insulation layer 24 and capping layer 40 (if used). If capping layer 40 is used, the patterning to form the desired vias or contact openings 50 will be applied over the upper surface of layer 40.

It should be noted that if one or more dopant materials are used in the formation of the low dielectric constant insulation layer, care must be taken in material selection for the filler material to be used in the contact openings. This is because the capping or encapsulation layers placed above and below the low dielectric constant layer will not prevent leaching out or migration of the dopant where the low dielectric constant layer is exposed when the contact opening is cut through the insulation layer. Thus, for example, it may be preferably to use tungsten as a filler material for the contact opening.

Still referring to FIG. 4, the structure shown in FIG. 3 is now shown formed with a contact opening 50 fried with a conductive filler material 54 such as tungsten and a first metallization layer 60 formed over capping layer 40 on first low dielectric constant insulation layer 24. First metallization layer 60 is now patterned to form the desired interconnects.

A capping or encapsulation layer 70 is then formed over first metallization layer 60 in preparation for forming a second low dielectric constant insulation layer over capping layer 70 and first metallization layer 60. This second low dielectric constant insulation layer may be formed in the same manner as first low dielectric constant insulation layer 24, i.e., by first forming a second composite layer 80, which may be identical in composition to first composition layer 20, and then removing the extractable material from it using one of the techniques previously discussed. However, as also previously discussed, care must be exercised if it is desired to heat second composite layer 80 prior to the extraction step to planarize it since the exercise of excessive heat may damage either first metallization layer 60 or first low dielectric constant insulation layer 24.

Figure 5:
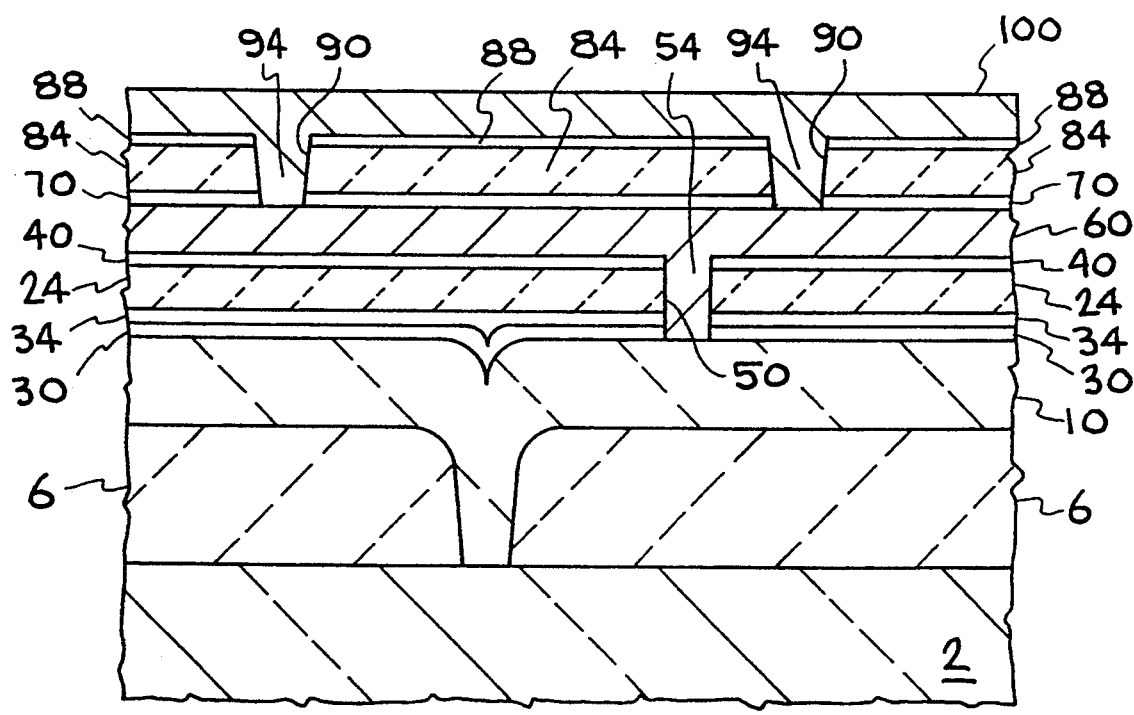
FIG. 5 is a fragmentary vertical cross-sectional view of the structure of FIG. 4 after formation of the second low dielectric constant insulation layer, formation of contact openings therein, and formation of a patterned second metallization layer over the second low dielectric constant insulation layer.

As shown in FIG. 5, after formation of a second low dielectric constant insulation layer 84 from second composite layer 80 shown in FIG. 4, a capping layer 88 may be optionally formed over second low dielectric constant insulation layer 84. Second low dielectric constant insulation layer 84, and capping layer 88 (if formed thereon) may then be patterned to form contact holes 90 to first metallization layer 60. Contact holes 90 may then be filled with conductive filler material 94 similarly to the filling of contact hole 50, and a second metallization layer 100 may then be deposited over the structure and patterned.

This process may then be optionally repeated again as many times as needed or desired to form further low dielectric constant insulation layers, in accordance with the invention, for as many subsequent metallization layers as will be used in the integrated circuit structure.

The following examples will serve to further illustrate the process of the invention:

EXAMPLE I

A first sealing layer of non-porous $SiO_2$ may be first deposited by CVD over an integrated circuit structure on a semiconductor wafer to a thickness of about 0.05 $\mu$m. Then about 1 $\mu$m of a composite layer, comprising about 90 wt. % $SiO_2$, 8 wt. % $GeO_2$, and 2 wt. % phosphorus, is deposited by CVD over the newly deposited non-porous $SiO_2$ layer. The composite layer is then contacted with deionized water to dissolve the $GeO_2$ extractable material, to thereby provide a doped solid matrix of $SiO_2$. The resulting aqueous solution of $GeO_2$ and water may now be removed from the composite layer and replaced with fresh deionized water by rinsing the composite layer until no further $GeO_2$ is found in the rinse water. The water is then removed from the composite layer by placing the coated wafer in a chamber and lowering the temperature until the water freezes. The pressure in the chamber is then reduced, using a vacuum pump, and the vapor from the frozen water is pumped out of the chamber with a monitor, e.g., a mass spectrometer, placed in the flow stream. When the monitor indicates that no more vapor is being pumped out, the pump may be shut off and the coated wafer removed from the chamber. A further sealing layer of non-porous $SiO_2$ may be then deposited over the resulting porous low dielectric constant $SiO_2$ insulation layer to a thickness of about 0.1 $\mu$m.

EXAMPLE II

The first sealing layer and composite layer described above in Example I may again be formed. The coated wafer is then immersed in ethyl alcohol in a pressurizable chamber to dissolve the $GeO_2$ extractable material in the composite layer. After several rinses to replace all of the resulting solution of dissolved $GeO_2$ and alcohol with fresh alcohol, i.e., pure alcohol in the composite layer, the pressure in the chamber is raised to about 100 atmospheres by pumping nitrogen into the chamber, and then the temperature is raised up to between about 600° C. and about 700° C. A small vent is then opened in the chamber and a mixture of nitrogen and vapor is allowed to flow out of the chamber, with sufficient nitrogen flow into the chamber maintained so as to prevent a pressure drop. The nitrogen/vapor is pumped out of the chamber with a monitor, e.g., a mass spectrometer, placed in the flow stream. When the monitor indicates that no more vapor is being pumped out, the pump may be shut off and the coated wafer removed from the chamber. As in Example I, a further non-porous $SiO_2$ sealing layer may then be deposited over the resulting porous low dielectric constant $SiO_2$ insulation material.

EXAMPLE III

A first sealing layer of non-porous $SiO_2$ is formed over an integrated circuit structure of a semiconductor wafer as in Example I. About 1.0 $\mu$m of a composite layer comprising an aqueous potassium silicate gel is then deposited over the $SiO_2$ sealing layer. The gel layer is then dried to remove the water and the wafer is then placed in a chamber and immersed in ethyl alcohol to dissolve the potassium counter ion in the dried gel layer. The resulting solution of potassium dissolved in ethyl alcohol may now be removed from the remaining matrix structure and replaced with fresh ethyl alcohol by repeated rinsing of the wafer until no further traces of potassium appear in the ethyl alcohol. the ethyl alcohol is then removed from the matrix structure either by the lyophilizing (freeze drying) method of Example I or the critical point extraction method of Example II and a further non-porous sealing layer of $SiO_2$ may then be deposited over the resulting porous low dielectric constant $SiO_2$ insulation material, as in Example I.

Thus, the invention provides a process for forming a low dielectric constant insulation layer wherein an insulation layer is first formed as a composite layer which includes one or more extractable materials the removal of which, leaves behind a porous matrix of the insulation material. The porous insulation material, due to its porous nature, has a lower dielectric constant, resulting in a lowering of the capacitance within an integrated circuit structure formed with such a low dielectric constant insulation layer or layers.

Having thus described the invention what is claimed is:

1. A process for forming a low dielectric constant insulation layer on an integrated circuit structure on a semiconductor wafer which comprises:
    a) depositing on said wafer a composite layer comprising one or more non-extractable insulation materials and one or more extractable materials; and
    b) removing said one or more extractable materials using a lyophilizing process leaving a porous structure comprising said one or more non-extractable insulation materials.

2. The process of claim 1 wherein said step of removing said one or more extractable materials using a lyophilizing process further includes the steps of:
    a) contacting said composite layer with a first liquid which is a solvent for said one or more extractable materials but not for said one or more non-extractable materials to form a solution of said first liquid and said one or more extractable materials; and
    b) removing the resulting solution of said first liquid and said one or more extractable materials from said composite layer.

3. The process of claim 2 wherein said step of removing said one or more extractable materials using a lyophilizing process further includes the steps of:
    a) rinsing said composite layer in a second liquid which is miscible with said first liquid and which also is not a solvent for said one or more non-extractable insulation materials; and b) removing said second liquid from said composite by lowering the temperature of said semiconductor wafer to a temperature below the freezing point of said second liquid in a vacuum chamber.

4. The process of claim 3 wherein said step of removing said one or more extractable materials using a lyophilizing process further includes maintaining said semiconductor wafer at said temperature in said vacuum chamber until substantially all of said second liquid has been removed from said composite layer thereby leaving a porous structure comprising said low dielectric constant insulation layer.

5. A process for forming a low dielectric constant insulation layer on an integrated circuit structure on a semiconductor wafer which comprises:
   a) depositing a composite layer over an integrated circuit structure on a semiconductor wafer comprising one or more matrix-forming insulation materials and one or more extractable materials; and
   b) removing said one or more extractable materials by:
      i) contacting said composite layer with a first liquid which is a solvent for said one or more extractable materials but not for said one or more matrix-forming materials to form a solution of said first liquid and said one or more extractable materials;
      ii) removing the resulting solution of said first liquid and said one or more extractable materials from said composite layer by rinsing said composite layer in a second liquid which is miscible with said first liquid and which also is not a solvent for said one or more matrix-forming materials;
      iii) removing said second liquid from said composite layer by lowering the temperature of said semiconductor wafer to a temperature below the freezing point of said second liquid in a vacuum chamber; and
      iv) maintaining said semiconductor wafer at said temperature in said vacuum chamber until substantially all of said second liquid has been removed from said composite layer;
   thereby leaving a porous structure comprising said low dielectric constant insulation layer.

6. The process of claim 5 wherein said vacuum chamber is maintained at a pressure below atmospheric pressure during said removal of said second liquid from said composite layer.

7. The process of claim 6 wherein said wafer is maintained at a temperature below the freezing point of said second liquid during said removal of said second liquid from said composite layer.

8. The process of claim 5 wherein said first and second liquids comprise the same solvent.

9. The process of claim 5 wherein said step of contacting said composite layer with said first liquid further comprises contacting said composite layer with a liquid selected from the group consisting of water, 2-methyltetrahydrofuran, and an alcohol.

10. The process of claim 9 wherein said step of forming said composite layer further comprises forming said composite layer with one or more optional dopants present.

11. The process of claim 10 including the further steps of:
   a) forming one or more lower non-porous insulation layers on said integrated circuit structure prior to said step of forming said composite layer, to thereby prevent downward migration of impurities from said porous structure into said integrated circuit structure; and
   b) forming one or more upper non-porous insulation layers over said low dielectric constant insulation layer after said step of removing said second liquid to thereby prevent upward migration of impurities from said porous structure into said integrated circuit structure.

12. The process of claim 9 wherein said matrix-forming insulation material comprises at least 0.5 wt. % of said composite layer prior to said removal step.

13. The process of claim 5 including the further step of heating said composite layer to planarize said layer prior to said extraction step.

14. The process of claim 5 wherein said step of forming said composite layer on said semiconductor wafer further comprises depositing said composite layer on said wafer by a chemical vapor deposition process.

15. The process of claim 14 wherein said step of forming said composite layer on said semiconductor wafer by a chemical vapor deposition process further comprises depositing said composite layer while maintaining a plasma in said vacuum chamber.

16. The process of claim 5 wherein said one or more matrix-forming materials comprises $SiO_2$.

17. The process of claim 5 wherein said one or more extractable materials comprises an oxide of germanium.

18. A process for forming a low dielectric constant insulation layer on an integrated circuit structure on a semiconductor wafer which comprises:
   a) depositing on said wafer a composite layer comprising one or more non extractable insulation materials and one or more extractable materials; and
   b) removing said one or more extractable materials using a critical point extraction process leaving a porous structure comprising said one or more insulation materials.

19. The process of claim 18 wherein said step of removing said one or more extractable materials using a critical point extraction process further includes the steps of:
   a) contacting said composite layer with a first liquid which is a solvent for said one or more extractable materials but not for said one or more non-extractable insulation materials to form a solution of said liquid and said one or more extractable materials; and
   b) removing the resulting solution of said first liquid and said one or more extractable materials from said composite layer.

20. The process of claim 19 wherein said step of removing said one or more extractable materials using a critical point extraction process further includes the steps of:
   a) rinsing said composite layer in a second liquid which is miscible with said first liquid and which also is not a solvent for said one or more non-extractable insulation materials; and
   b) removing said second liquid from said composite layer by removing said second liquid from said composite layer in a pressurized chamber by first raising the pressure in said chamber above the critical point of said second liquid and then raising the temperature of said composite layer to a temperature above the critical point of said second liquid.

21. The process of claim 20 wherein said step of removing said one or more extractable materials using a critical point extraction process further includes maintaining said semiconductor wafer at said temperature and pressure until substantially all of said second liquid has been removed from said composite layer, thereby leaving a porous structure comprising said low dielectric constant insulation layer.

22. A process for forming a low dielectric constant insulation layer on an integrated circuit structure on a semiconductor wafer which comprises:
   a) depositing a composite layer over an integrated circuit structure on a semiconductor wafer comprising one or more matrix-forming insulation materials and one or more extractable materials; and
   b) removing said one or more extractable materials by:
      i) contacting said composite layer with a first liquid which is a solvent for said one or more extractable materials but not for said one or more matrix-forming materials;
      ii) removing the resulting solution of said first liquid and said one or more extractable materials from said composite layer by rinsing said composite layer in a second liquid which is miscible with said first liquid and which also is not a solvent for said one or more matrix-forming materials;
      iii) removing said second liquid from said composite layer in a pressurized chamber by first raising the pressure in said chamber above the critical point of said second liquid and then raising the temperature of said composite layer to a temperature above the critical point of said second liquid;
      iv) maintaining said wafer at said temperature and pressure until substantially all of said second liquid has been removed from said composite layer;
   thereby leaving a porous structure comprising said low dielectric constant insulation layer.

23. The process of claim 22 wherein said first and second liquids comprise the same solvent.

24. The process of claim 22 wherein said step of forming said composite layer further comprises forming said composite layer with one or more optional dopants present.

25. The process of claim 24 including the further steps of:
   a) forming one or more lower non-porous insulation layers on said integrated circuit structure prior to said step of forming said composite layer, to thereby prevent downward migration of impurities from said porous structure into said integrated circuit structure; and
   b) forming one or more upper non-porous insulation layers over said low dielectric constant insulation layer after said step of removing said second liquid to thereby prevent upward migration of impurities from said porous structure into said integrated circuit structure.

26. The process of claim 22 wherein said matrix-forming insulation material comprises at least 0.5 wt. % of said composite layer prior to said removal step.

27. The process of claim 22 including the further step of heating said composite layer to planarize said layer prior to said extraction step.

28. The process of claim 22 wherein said step of forming said composite layer on said semiconductor wafer further comprises depositing said composite layer on said wafer by a chemical vapor deposition process.

29. The process of claim 28 wherein said step of forming said composite layer on said semiconductor wafer by a chemical vapor deposition process further comprises depositing said composite layer while maintaining a plasma in said vacuum chamber.

30. The process of claim 22 wherein said one or more matrix-forming materials comprises $SiO_2$.

31. The process of claim 22 wherein said one or more extractable materials comprises an oxide of germanium.

32. A process for forming a low dielectric constant insulation layer on an integrated circuit structure on a semiconductor wafer which comprises:
   a) forming a composite layer comprising a gel over an integrated circuit structure on a semiconductor wafer, said gel comprising one or more non-extractable insulation materials and one or more extractable materials; and
   b) removing said one or more extractable materials leaving a porous structure comprising said one or more non-extractable insulation materials.

33. The process of claim 32 wherein said step of forming a composite layer comprising a gel includes the further steps of:
   a) drying said composite gel layer;
   b) contacting said dried composite layer with a first liquid which is a solvent for said one or more extractable materials but not for said one or more non-extractable insulation materials to form a solution of said one or more extractable materials;
   c) removing the resulting solution of said first liquid and said one or more extractable materials from said composite layer by rinsing said composite layer in a second liquid which is miscible with said first liquid and which also is not a solvent for said one or more matrix-forming materials; and
   d) removing said second liquid from said composite layer leaving a porous structure comprising said low dielectric constant insulation layer.

34. The process of claim 33 wherein said step of forming said composite layer comprising a gel further comprises forming a gel from a metal silicate.

35. The process of claim 34 wherein said metal is selected from the group consisting of alkali metals and alkaline earth metals.

36. The process of claim 34 wherein said gel is formed with an aqueous liquid.

37. The process of claim 33 wherein said step of contacting said dried composite layer with said first liquid further comprises contacting said composite layer with an alcohol.

38. The process of claim 32 wherein said first and second liquids comprise the same solvent.

39. The process of claim 33 wherein said step of removing said second liquid further comprises the steps of lowering the temperature of said semiconductor wafer to a temperature below the freezing point of said second liquid in a vacuum chamber; and maintaining said semiconductor wafer at said temperature in said vacuum chamber until substantially all of said second liquid has been removed from said composite layer.

40. The process of claim 33 wherein said step of removing said second liquid further comprises removing said second liquid in a pressurized chamber by first raising the pressure in said chamber above the critical point of said second liquid and then raising the temperature of said composite layer to a temperature above the critical point of said second liquid; and maintaining said wafer at said temperature and pressure until substantially all of said second liquid has been removed from said composite layer.

41. The process of claim 33 including the further steps of:
   a) forming one or more lower non-porous insulation layers on said integrated circuit structure prior to said step of forming said composite layer; and
   b) forming one or more upper non-porous insulation layers over said low dielectric constant insulation layer after said step of removing said second liquid.

42. A process for forming a low dielectric constant insulation layer on an integrated circuit structure on a semiconductor wafer which comprises:
   a) forming a composite gel layer over an integrated circuit structure on a semiconductor wafer, said composite gel layer comprising one or more matrix-forming insulation materials and one or more extractable materials; and
   b) removing said one or more extractable materials by:
      i) contacting said composite gel layer with a first liquid which is a solvent for said one or more extractable materials but not for said one or more matrix-forming materials to form a solution of said first liquid and said one or more extractable materials;
      ii) removing the resulting solution of said first liquid and said one or more extractable materials from said composite gel layer by rinsing said composite gel layer in a second liquid which is miscible with said first liquid and which also is not a solvent for said one or more matrix-forming materials;
      iii) removing said second liquid from said composite gel layer by lowering the temperature of said semiconductor wafer to a temperature below the freezing point of said second liquid in a vacuum chamber; and
      iv) maintaining said semiconductor wafer at said temperature in said vacuum chamber until substantially all of said second liquid has been removed from said composite layer;
   thereby leaving a porous structure comprising said low dielectric constant insulation layer.

43. A process for forming a low dielectric constant insulation layer on an integrated circuit structure on a semiconductor wafer which comprises:
   a) forming a composite layer over an integrated circuit structure on a semiconductor wafer comprising one or more matrix-forming insulation materials and one or more extractable materials; and
   b) removing said one or more extractable materials by:
      i) contacting said composite layer with a first liquid which is a solvent for said one or more extractable materials but not for said one or more matrix-forming materials and selected from the group consisting of an alcohol and 2-methyl tetrahydrofuran;
      ii) removing the resulting solution of said first liquid and said one or more extractable materials from said composite layer by rinsing said composite layer in a second liquid which is miscible with said first liquid and which also is not a solvent for said one or more matrix-forming materials;
      iii) removing said second liquid from said composite layer in a pressurized chamber by first raising the pressure in said chamber above the critical point of said second liquid and then raising the temperature of said composite layer to a temperature above the critical point of said second liquid;
      iv) maintaining said wafer at said temperature and pressure until substantially all of said second liquid has been removed from said composite layer;
   thereby leaving a porous structure comprising said low dielectric constant insulation layer.

44. A process for forming a low dielectric constant insulation layer on an integrated circuit structure on a semiconductor wafer which comprises:
   a) forming a composite gel layer over an integrated circuit structure on a semiconductor wafer, said composite gel layer comprising one or more matrix-forming insulation materials and one or more extractable materials; and
   b) removing said one or more extractable materials by:
      i) contacting said composite gel layer with a first liquid which is a solvent for said one or more extractable materials but not for said one or more matrix-forming materials;
      ii) removing the resulting solution of said first liquid and said one or more extractable materials from said composite layer by rinsing said composite gel layer in a second liquid which is miscible with said first liquid and which also is not a solvent for said one or more matrix-forming materials;
      iii) removing said second liquid from said composite gel layer in a pressurized chamber by first raising the pressure in said chamber above the critical point of said second liquid and then raising the temperature of said composite layer to a temperature above the critical point of said second liquid;
      iv) maintaining said wafer at said temperature and pressure until substantially all of said second liquid has been removed from said composite layer;
   thereby leaving a porous structure comprising said low dielectric constant insulation layer.

* * * * *

UNITED STATES PATENT AND TRADEMARK OFFICE
CERTIFICATE OF CORRECTION

PATENT NO. : 5,393,712

DATED : February 28, 1995

INVENTOR(S) : Michael D. Rostoker, Nicholas F. Pasch, and Ashok K. Kapoor

It is certified that error appears in the above-identified patent and that said Letters Patent is hereby corrected as shown below:

Title Page:

Item [75], Inventors, col. 1, line 1, change "San Jose" to "Boulder Creek".

Item [56], References Cited, col. 1, line 4, change "Gephd x" to "$Ge_x$".

Item [56], References Cited, col. 1, line 10, change "Integration" to "Technology"

Item [56], References Cited, col. 2, line 1, change "process" to "Process".

Item [56], References Cited, col. 2, line 2, change "integration" to "Integration".

Item [56], References Cited, col. 2, line 2, delete "of".

Item [56], References Cited, col. 2, line 2, change "106-105" to "104-105".

Col. 1, line 36, change "mount" to "amount".

Col. 4, line 45, change "mount" to "amount".

Col. 4, line 54, change "mount" to "amount".

Col. 4, line 56, change "mount" to "amount".

Col. 4, line 61, change "mount" to "amount".

Col. 6, line 44, change "mounts" to "amounts".

Col. 6, line 49, change "mount" to "amount".

Col. 6, line 52, change "mount" to "amount".

UNITED STATES PATENT AND TRADEMARK OFFICE
CERTIFICATE OF CORRECTION

PATENT NO. : 5,393,712

DATED : February 28, 1995

INVENTOR(S) : Michael D. Rostoker, Nicholas F. Pasch, and Ashok K. Kapoor

It is certified that error appears in the above-identified patent and that said Letters Patent is hereby corrected as shown below:

Col. 7, line 67, insert "," after "(50 hours)".

Col. 8, line 30, insert "," after "carried out".

Col. 10, line 50, change "fried" to "filled".

Col. 16, line 55, claim 38, change "32" to "33".

Signed and Sealed this

Twenty-fifth Day of July, 1995

Attest:

BRUCE LEHMAN

Attesting Officer     Commissioner of Patents and Trademarks